(12) United States Patent
Gambe (10) Patent No.: US 8,956,098 B2
(45) Date of Patent: Feb. 17, 2015

(54) AUTOMATED WAREHOUSE

(75) Inventor: Masahiko Gambe, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 14/114,782

(22) PCT Filed: Mar. 13, 2012

(86) PCT No.: PCT/JP2012/001733
§ 371 (c)(1),
(2), (4) Date: Oct. 30, 2013

(87) PCT Pub. No.: WO2012/150644
PCT Pub. Date: Nov. 8, 2012

(65) Prior Publication Data
US 2014/0056671 A1    Feb. 27, 2014

(30) Foreign Application Priority Data

May 2, 2011    (JP) .................... 2011-103242

(51) Int. Cl.
*B65G 1/06* (2006.01)
*H01L 21/677* (2006.01)
(52) U.S. Cl.
CPC .... H01L 21/67769 (2013.01); H01L 21/67772 (2013.01); H01L 21/67775 (2013.01)
USPC ........................................................ 414/267
(58) Field of Classification Search
CPC ............. B65G 1/06; B65D 88/32; B27N 3/22
USPC .......................................... 414/267, 939, 736
See application file for complete search history.

(56) References Cited

U.S. PATENT DOCUMENTS

| | | | | |
|---|---|---|---|---|
| 5,411,358 | A | * | 5/1995 | Garric et al. .................. 414/277 |
| 5,607,275 | A | * | 3/1997 | Woodruff et al. ........ 414/331.05 |
| 5,881,668 | A | * | 3/1999 | Begin et al. .................... 118/500 |
| 6,026,561 | A | * | 2/2000 | Lafond ............................ 29/722 |
| 6,082,949 | A | * | 7/2000 | Rosenquist .................... 414/217 |
| 6,468,021 | B1 | * | 10/2002 | Bonora et al. ................. 414/522 |
| 6,506,009 | B1 | * | 1/2003 | Nulman et al. ............ 414/217.1 |
| 7,299,831 | B2 | * | 11/2007 | Elliott et al. .................... 141/98 |
| 7,433,756 | B2 | * | 10/2008 | Rice et al. ...................... 700/213 |
| 7,445,415 | B2 | * | 11/2008 | Bonora et al. ............. 414/217.1 |

(Continued)

FOREIGN PATENT DOCUMENTS

| | | |
|---|---|---|
| JP | 7-50334 A | 2/1995 |
| JP | 10-157847 A | 6/1998 |

OTHER PUBLICATIONS

Official Communication issued in International Patent Application No. PCT/JP2012/001733, mailed on Jun. 26, 2012.

(Continued)

*Primary Examiner* — Saul Rodriguez
*Assistant Examiner* — Emery Hassan
(74) *Attorney, Agent, or Firm* — Keating & Bennett, LLP (57) ABSTRACT

A clean stocker includes a storage rack storing an article, a load port holding a case and including a loading and unloading space to load and unload the article to and from the held case, a transferring apparatus including a holding space to hold the article and transfer the article between the holding space and the storage rack and between the holding space and the case held in the loading and unloading space, the holding space being kept clean, and a first shield closing the holding space and traveling together with the transferring apparatus.

4 Claims, 13 Drawing Sheets

(56) References Cited

U.S. PATENT DOCUMENTS

| | | | |
|---|---|---|---|
| 7,458,763 B2* | 12/2008 | van der Meulen | 414/805 |
| 7,661,919 B2* | 2/2010 | Bonora et al. | 414/222.01 |
| 7,887,276 B2* | 2/2011 | Natume | 414/217 |
| 8,562,272 B2* | 10/2013 | Lenz | 414/217 |
| 2001/0043849 A1* | 11/2001 | Perlov et al. | 414/222.01 |
| 2003/0113189 A1* | 6/2003 | Kaji et al. | 414/217 |
| 2006/0286300 A1* | 12/2006 | Ishikawa et al. | 427/331 |
| 2008/0023417 A1 | 1/2008 | Yamamoto | |
| 2008/0166208 A1* | 7/2008 | Lester et al. | 414/217 |
| 2009/0185892 A1* | 7/2009 | Aburatani | 414/806 |
| 2011/0129321 A1 | 6/2011 | Rebstock | |
| 2012/0201634 A1 | 8/2012 | Hiroki | |

OTHER PUBLICATIONS

Official Communication issued in corresponding Japanese Patent Application No. 2013-513063, mailed on Jul. 1, 2014.

English translation of Official Communication issued in corresponding International Application PCT/JP2012/001733, mailed on Nov. 14, 2013.

* cited by examiner

AUTOMATED WAREHOUSE

BACKGROUND OF THE INVENTION

1. Field of the Invention

The present invention relates to automated warehouses and, in particular, to an automated warehouse which stores articles in a clean space.

2. Description of the Related Art

Reticles have been used for manufacturing electronic components, and are stored in a clean stocker placed in a clean room (See Japanese Unexamined Patent Application Publication No. 2008-30914, for example). In the clean stocker, the reticles are taken out of pods for storage, and the environment inside the clean stocker chassis needs to be kept from volatile impurities.

A clean stocker disclosed in Japanese Unexamined Patent Application Publication No. 2008-30914 is equipped with a clean gas supply unit, placed in the upper part of the chassis of the clean stocker, to supply clean gas in order to prevent the volatile impurities from entering the chassis.

The above conventional structure, however, requires the clean gas to be supplied to spaces for holding and transporting reticles taken out of pods; specifically, all the spaces inside a pod opener, inside a rotation rack, and between the pod opener and the rotation rack (transportation route for the reticles).

Here, a chemical filter for the clean gas supply unit is a very expensive and expendable, and the life of the chemical filter decreases with an increasing amount of airflow. In other words, in the case where the clean gas is to be supplied to all the above spaces, the chemical filter will have to be replaced in a short period of time and the resulting expenses for the storage will increase. The expenses will further increase in the case where the environment inside the chassis is to be kept from moisture as well as the volatile impurities (hereinafter referred to as "clean space").

SUMMARY OF THE INVENTION

In view of the above problems, preferred embodiments of the present invention provide an automated warehouse which is capable of efficiently storing articles in a clean space.

An automated warehouse according to a preferred embodiment of the present invention places an article in a case, and brings in and takes out the article. Specifically, the automated warehouse includes a storage rack which stores articles including the article; a load port which holds the case and includes a loading and unloading space to load and unload the article to and from the held case; a transferring apparatus which includes a holding space to hold the article and transfers the article between the holding space and the storage rack and between the holding space and the case held in the loading and unloading space, the holding space being kept clean; and a first shield which closes the holding space and travels together with the transferring apparatus.

The above structure allows the holding space alone to be kept clean instead of the entire transportation route of articles. Hence, the space to be cleaned is much smaller, which contributes to a decrease in storage expenses and efficient storage of articles.

It is noted that the language "closed" in the description of preferred embodiments of the present invention does not necessarily mean sealing a space as far as impurities are kept from entering the space. In the above example, the first shield may seal the opening for the holding space to keep impurities from entering the holding space. Alternatively, in order to keep impurities from entering the holding space, the first shield may be arranged so that there is a narrow clearance between the first shield and the opening for the holding space in order to let the clean gas in the holding space always escape via the clearance.

According to a preferred embodiment of the present invention, the load port may travel together with the transferring apparatus so that the holding space of the transferring apparatus and the loading and unloading space are connected with each other. The first shield may close to keep clean the loading and unloading space and the holding space connected with each other.

The above features allow the article taken out of a case at the load port to be transported to the storage rack without moving the article out of a clean space. Hence, the space to be cleaned is smaller, and contamination of the article is effectively prevented.

According to another preferred embodiment of the present invention, the first shield may include a cylinder to contain a rotatable transferring apparatus; a first opening arranged on a side of the cylinder to face the load port; and a second opening arranged on a side of the cylinder to face the storage rack. The transferring apparatus may: rotate to a position where an opening for the holding space faces the first opening, and transfer the article between the holding space and the load port; rotate to a position where the opening for the holding space faces the second opening, and transfer the article between the holding space and the storage rack; and rotate to a position where the opening for the holding space faces an inner sidewall of the cylinder, and travel together with the first shield with the holding space closed.

According to the above features, the transferring apparatus may rotate inside the first shield so that the opening for the holding space is exposed only when the apparatus transfers the article and closed when apparatus travels. Hence, the space to be cleaned is smaller, and contamination of the article is effectively prevented.

Moreover, the transferring apparatus may further be capable of vertically traveling inside the cylinder, and prior to the rotation inside the cylinder, the transferring apparatus may ascend or descend to a position where the opening for the holding space does not face either the first opening or the second opening. Such a feature prevents the opening from being exposed while the transferring apparatus is rotating.

Furthermore, the automated warehouse may include a second shield which is attached to an outer sidewall of the cylinder, travels together with the transferring apparatus and the first shield, and closes a loading and unloading opening on the storage rack to transfer the article when arriving at a position to face the storage rack. The second shield may include a connecting hole to selectively connect between the second opening on the first shield and a portion of the loading and unloading opening on the storage rack, the selective connection being made only to the portion through which the article passes. Such features make it possible to limit the area of the loading and unloading opening on the storage rack to a bare minimum, which contributes to more effective prevention of the contamination of the article.

Various preferred embodiments of the present invention allow a holding space alone to be kept clean instead of the entire transportation route of articles. Hence, the space that is to be kept clean is much smaller and contamination of the articles is successfully prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention shall be described hereinafter with reference to the drawings.

Preferred Embodiment 1

Figure 1:
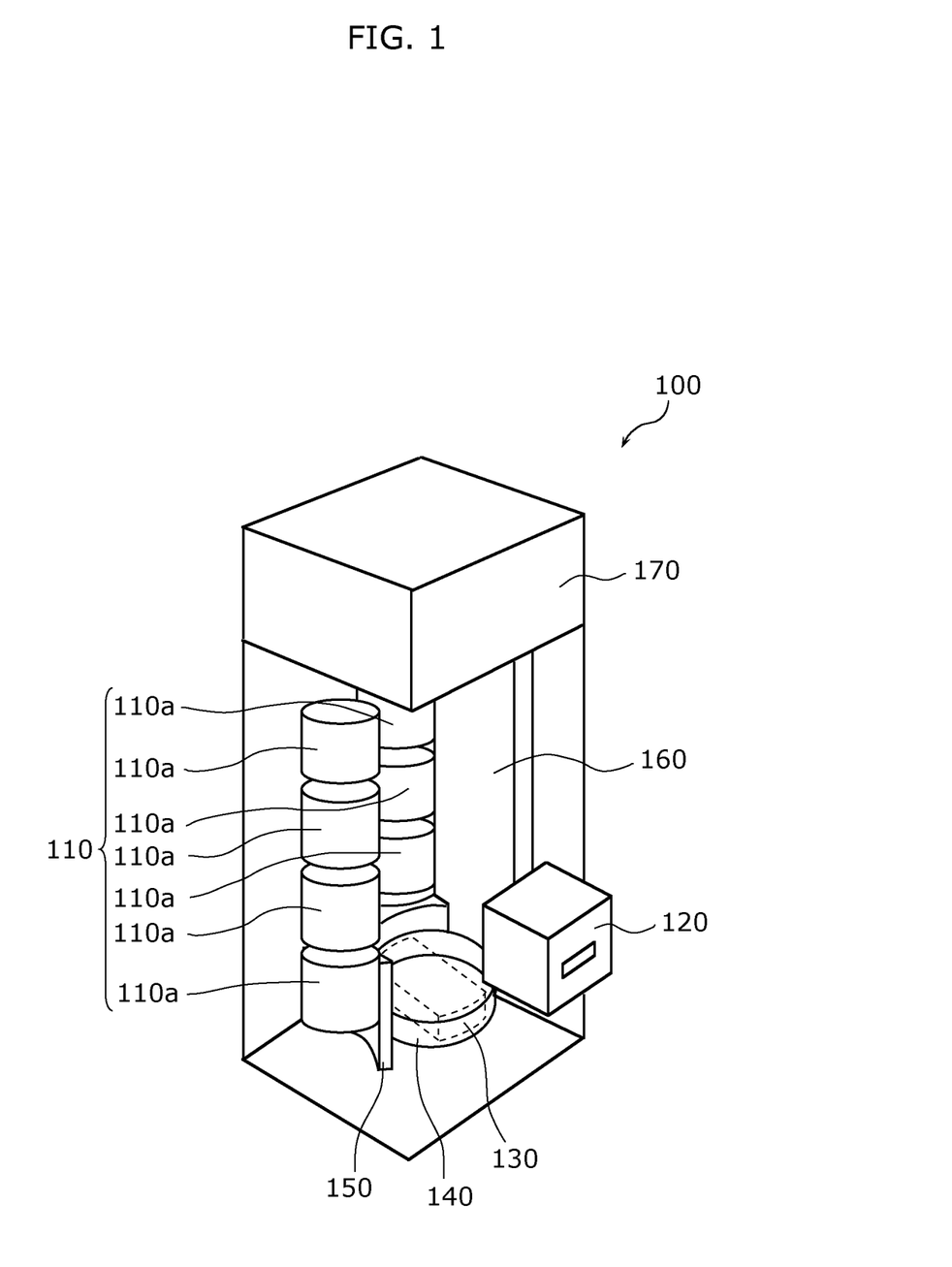
FIG. 1 schematically shows a clean stocker according to Preferred Embodiment 1 of the present invention.

FIG. 1 schematically shows a clean stocker 100 which exemplifies an automated warehouse according to Preferred Embodiment 1 of the present invention. As shown in FIG. 1, the clean stocker 100 mainly includes a storage rack 110, a load port 120, a transferring apparatus 130, a first shield 140, a second shield 150, an elevator guide 160, and a cleaning unit (fan filter unit or FFU) 170. The clean stocker 100 is preferably installed in a clean room of a semiconductor factory or a liquid crystal display factory, and separately stores reticles (articles) for exposure for either semiconductors or liquid crystal substrates, and pods (cases) for containing the reticles.

The storage rack 110 stores a reticle taken out of a pod. The structure of the storage rack 110 shall not be defined in particular. As the example in FIG. 1 shows, the storage rack 110 preferably includes multiple reticle chambers 110a. More specifically, the reticle chambers 110a are vertically arranged in a first column (on the left column in FIG. 1) and a second column (on the right column in FIG. 1) so that the first and second columns are provided around the transferring apparatus 130.

Figure 2:
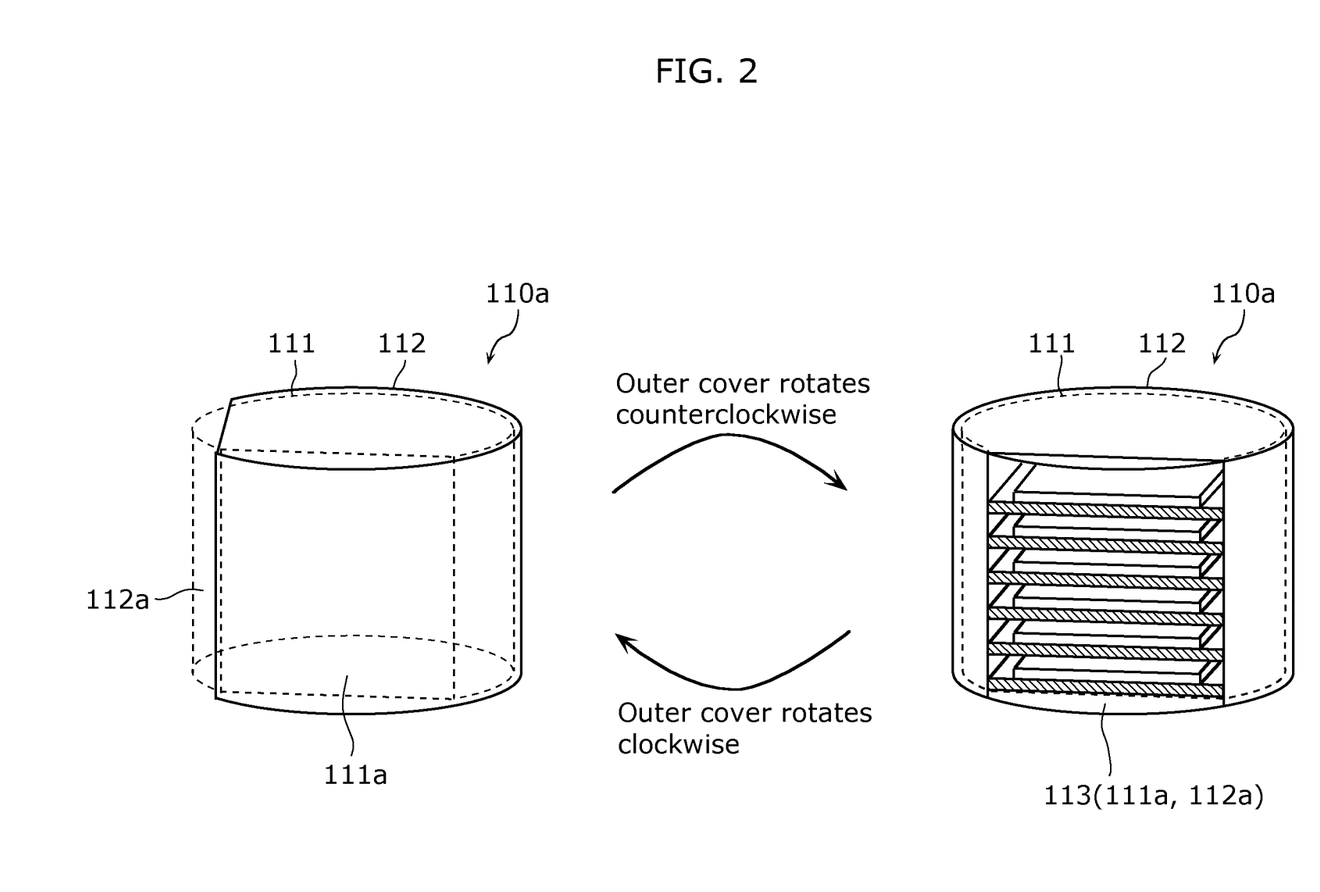
FIG. 2 shows an exemplary reticle chamber.

FIG. 2 shows an exemplary reticle chamber 110a. As shown in FIG. 2, a reticle chamber 110a includes an inner cover 111 that is cylindrical or substantially cylindrical, and an outer cover 112 which is slightly larger than the inner cover 111 and is cylindrical or substantially cylindrical. The inner cover 111 and the outer cover 112 respectively include an opening 111a and an opening 112a on their sides.

The inner cover 111 includes racks to place reticles and is fixed so that the opening 111a faces the transferring apparatus 130. The inside of the inner cover 111 is kept clean by the cleaning unit 170. The outer cover 112 covers the inner cover 111 and rotates around the inner cover 111.

When the outer cover 112 rotates and the openings 111a and 112b shift away from each other (on the left in FIG. 2), the loading and unloading of the reticles is denied (the reticle chamber 110a closed). When the outer cover 112 rotates and the openings 111a and 112a overlap with each other (on the right in FIG. 2), the loading and unloading of the reticles is allowed (the reticle chamber 110a open). In other words, the overlapping openings 111a and 112b define a loading and unloading opening 113 on the reticle chamber 110a.

The load port 120 operates as an interface to bring in and take out a reticle contained in a pod, as well as a pod opener (loading and unloading apparatus) to place and take the reticle in and out of the pod.

FIGS. 3 to 6 show operations of the load port 120 that works as a loading and unloading apparatus. Described with reference to FIGS. 3 to 6 are a structure of the load port 120 and operations to take a reticle out of a pod. It is noted that the process below is reversed to place the reticle in the pod, and the details thereof shall be omitted.

The load port 120 includes a loading and unloading space 121 to be used to take a reticle out of a pod and place the reticle into the pod. Moreover, the loading and unloading space 121 is kept clean by the cleaning unit 170.

Figure 3:
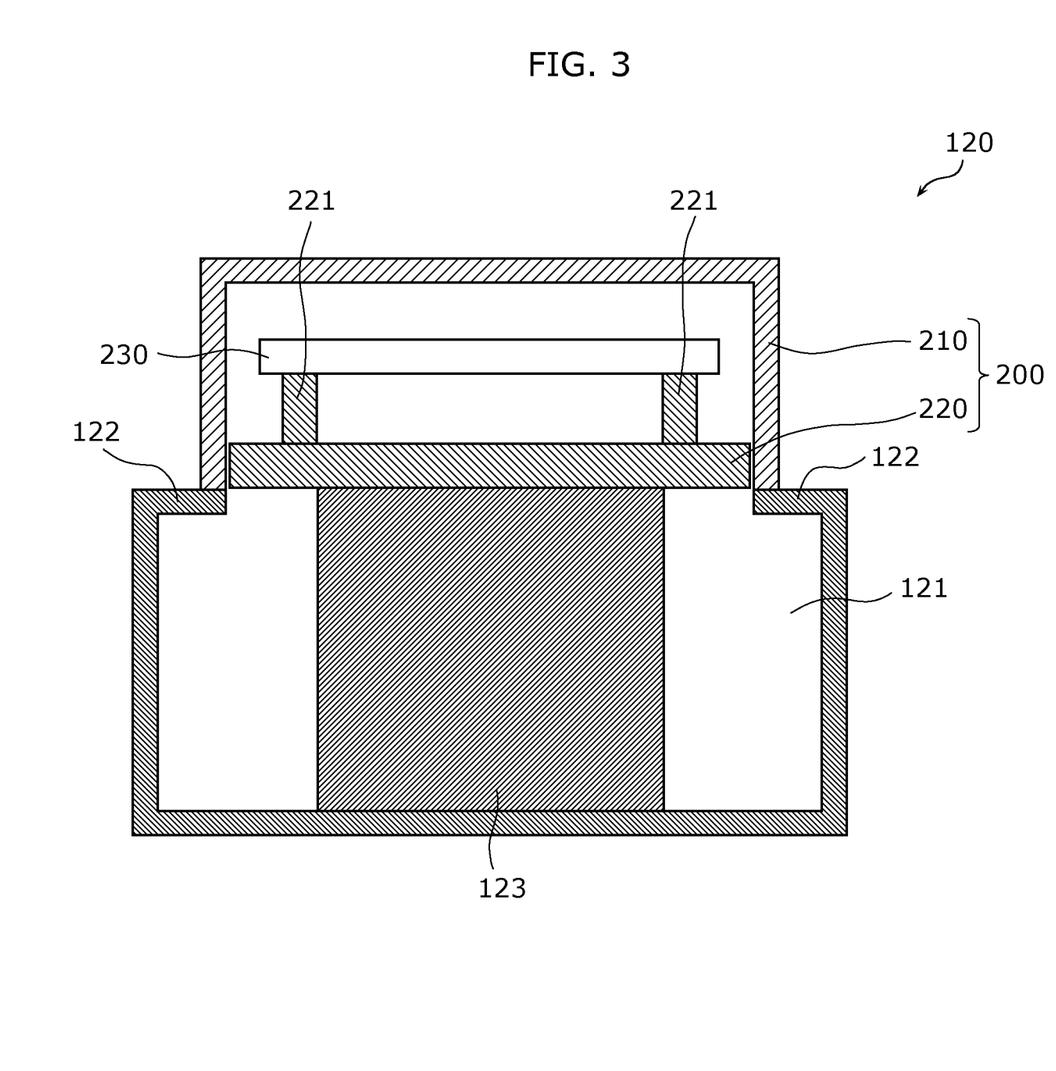
FIG. 3 shows how a pod containing a reticle is brought into a load port.

As shown in FIG. 3, a pod 200 includes a cover 210 and a door 220 which are vertically separatable from each other. Moreover, on the top surface of the door 220, multiple protrusions 221 are provided to support the reticle.

The load port 120 includes a locking portion 122 to lock the cover 210 and a platform 123 to keep the door 220 thereon. It is noted that the platform 123 operates as an elevator which vertically travels with the door 220 kept thereon.

The load port 120 includes an opening on the top thereof. The locking portion 122 is provided around the opening. The platform 123 is placed inside the load port 120 (specifically, in the loading and unloading space 121) to face the opening provided on the top of the load port 120. The top of the load port 120 and the platform surface (top surface) of the platform 123 are to be positioned on the same level when the platform 123 ascends to the uppermost level.

The pod 200 is then placed on the platform 123 that ascends to the uppermost level. Hence, the opening of the load port 120 is closed by the pod 200. In other words, the loading and unloading space 121 is specifically a space which is partitioned by the load port 120 and the cover 210 of the pod 200.

Figure 4:
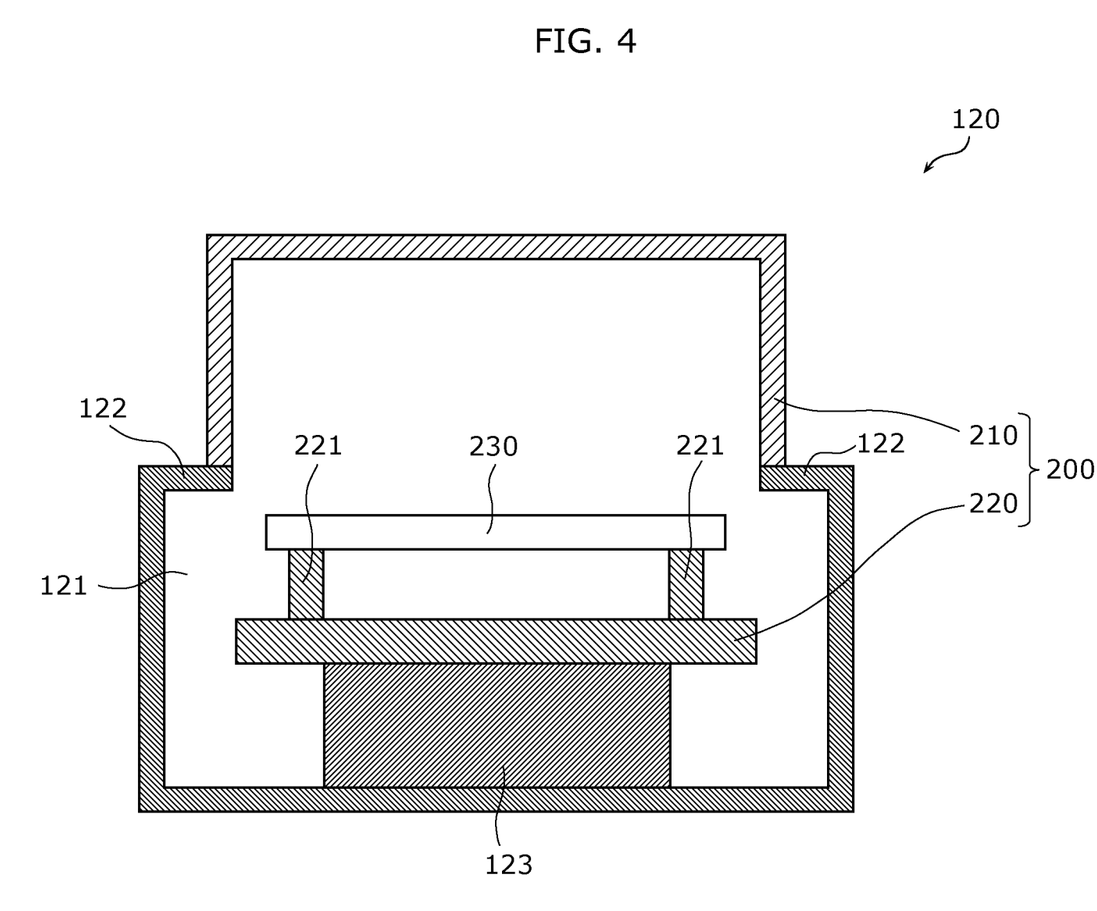
FIG. 4 shows how the pod is vertically separated.

The opening of the load port 120 is slightly larger than the door 220 and smaller than the cover 210. Thus, when the platform 123 descends with the pod 200 placed thereon, the door 220 descends along with the platform 123 and the cover 210 is locked by the locking portion 122. Hence, as shown in FIG. 4, the cover 210 and the door 220 are vertically separated from each other.

Figure 5:
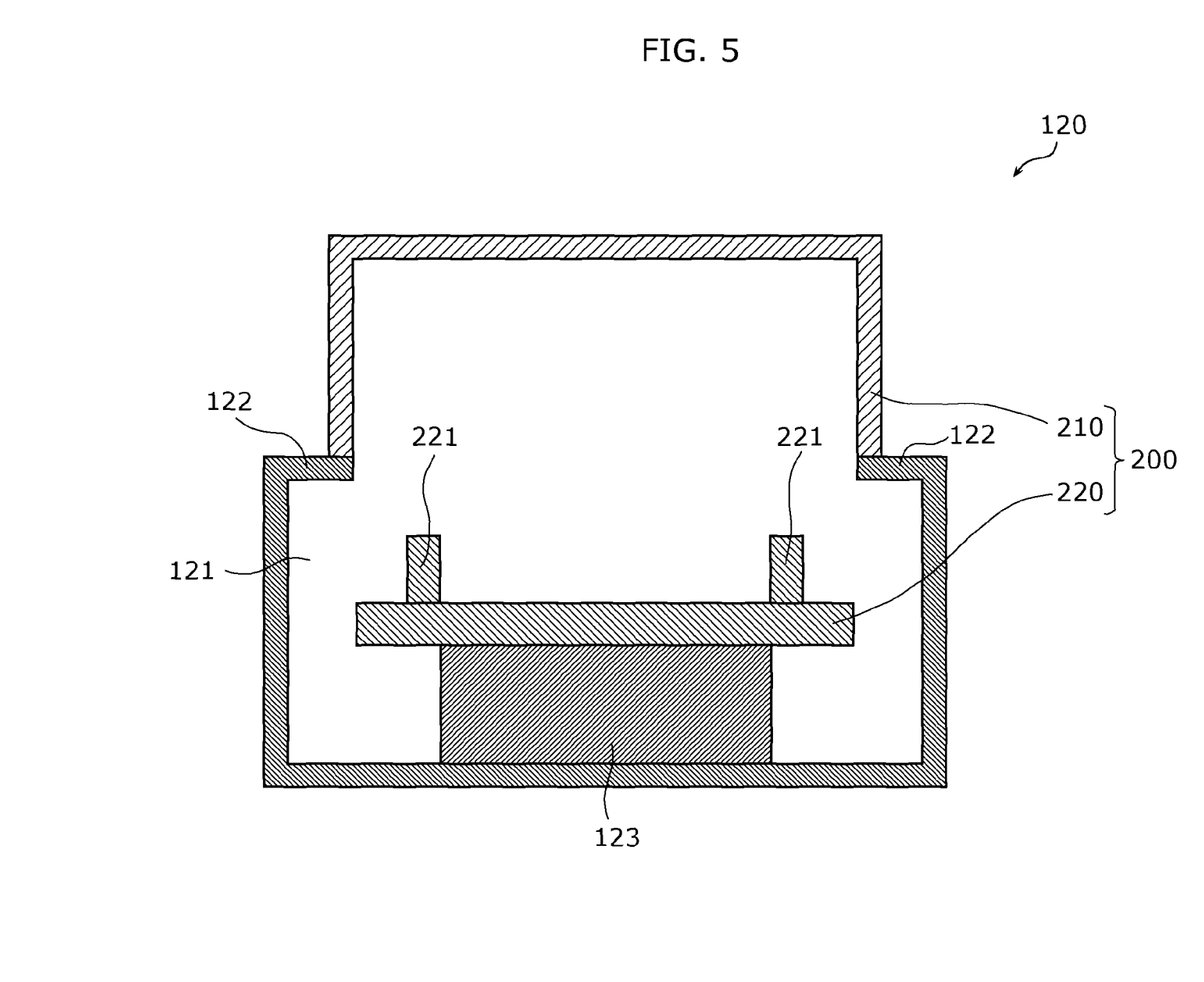
FIG. 5 shows how the pod looks immediately after the reticle has been taken out.
Figure 6:
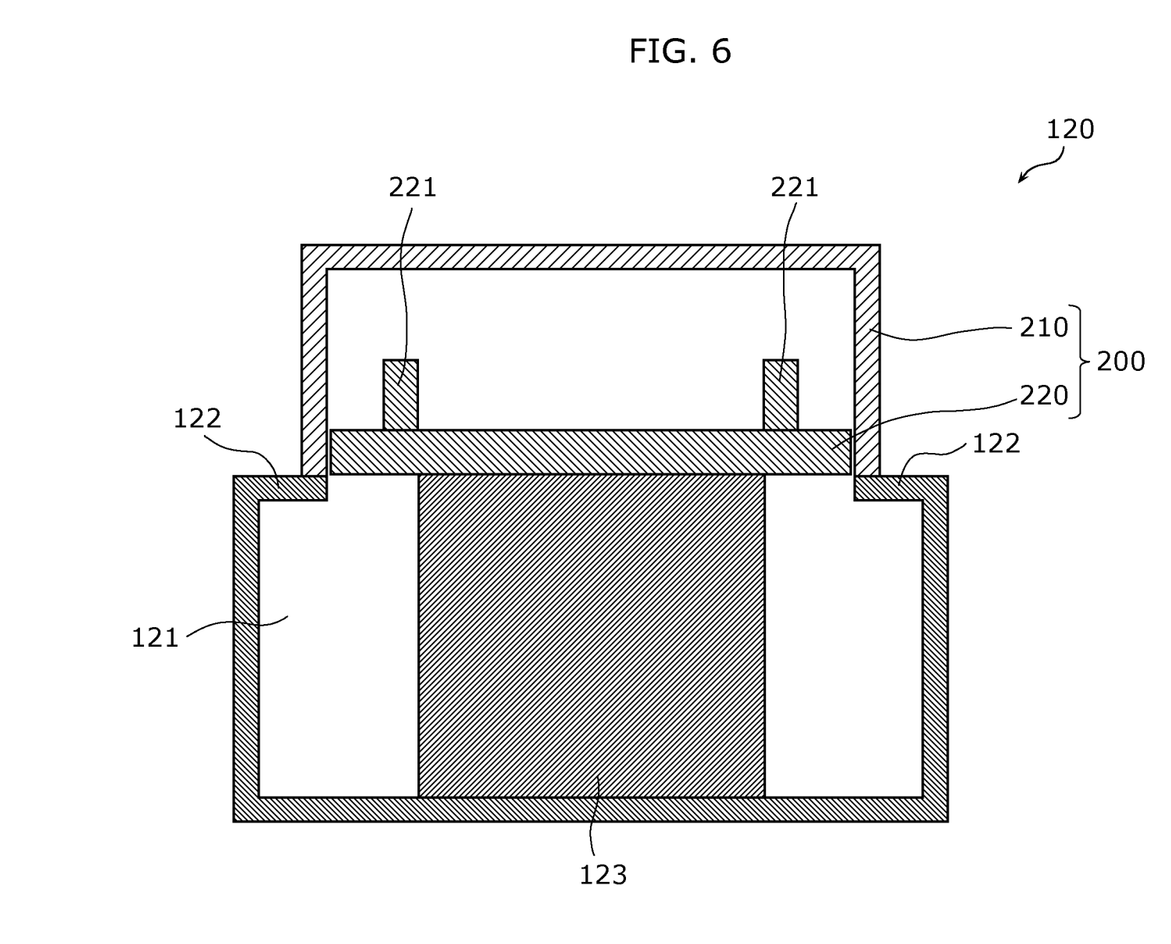
FIG. 6 shows how the pod looks when closed again.

Next, the reticle 230 placed over the door 220 is removed by the transferring apparatus 130, so that the load port 120 looks as shown in FIG. 5. When the platform 123 ascends with the door 220 placed thereon, the cover 210 is closed again with the door 220 as shown in FIG. 6. The empty pod 200 shown in FIG. 6 is taken out of the load port 120 by a pod transporting apparatus (not shown) and stored on a pod storage rack (not shown).

Figure 7:
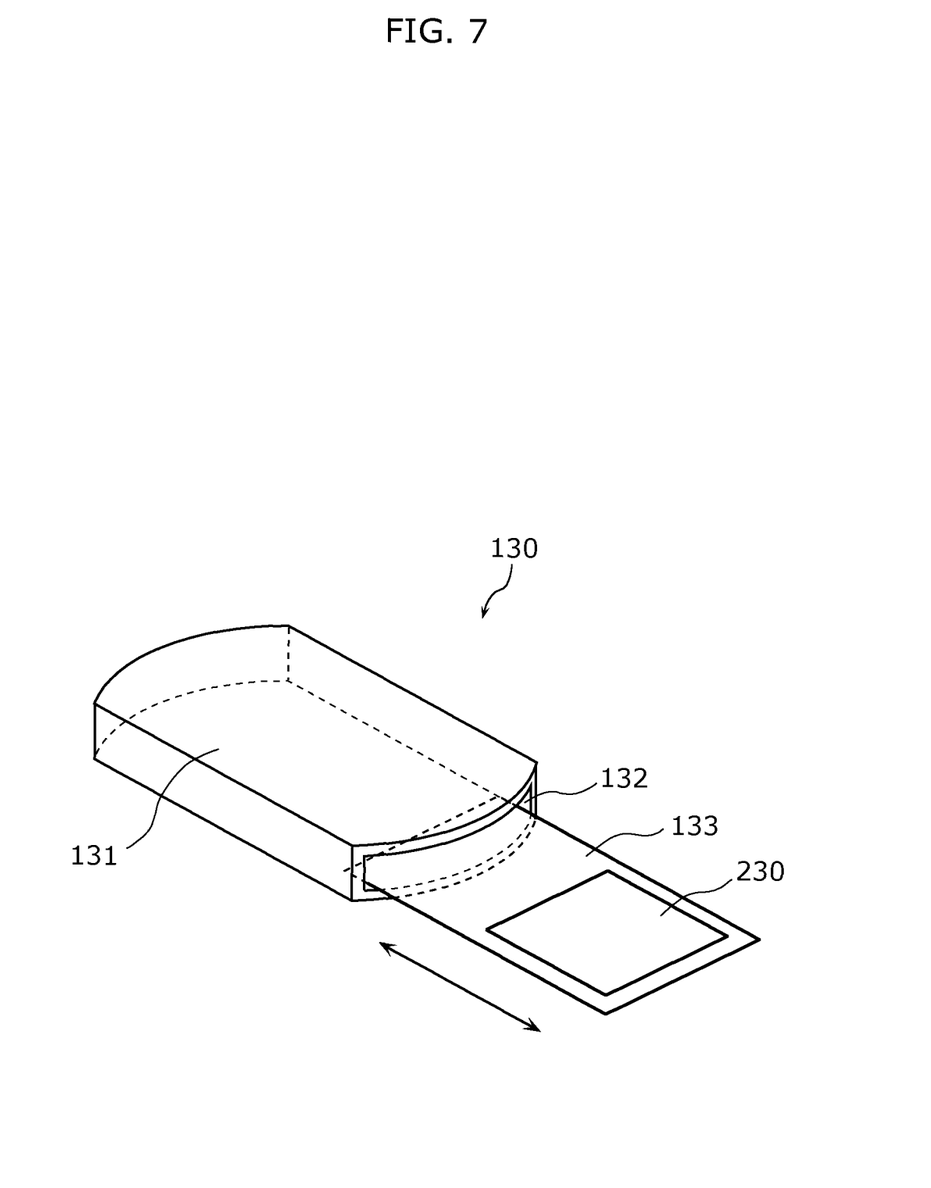
FIG. 7 schematically shows a transferring apparatus.

The transferring apparatus 130 transfers a reticle between the storage rack 110 and the load port 120. FIG. 7 shows an exemplary structure of the transferring apparatus 130. As shown in FIG. 7, the transferring apparatus 130 includes a holding space 131 to hold the reticle 230 therein. Using a sliding fork 133 which ejects from and retracts into the holding space 131 via the opening 132, the transferring apparatus 130 transfers the reticle 230 between the storage rack 110 and the holding space 131 and between the holding space 131 and the pod 200 that is held in the loading and unloading space 121 of the load port 120. Moreover, the holding space 131 is kept clean by the cleaning unit 170.

As shown in FIGS. 8A to 8D, the transferring apparatus 130 is placed inside a first shield 140. The first shield 140 includes a cylinder 141 that accommodates the transferring apparatus 130, and first to third openings 142, 143, and 144 provided on the side of the cylinder 141.

The first opening 142 is arranged to face the load port 120. The second opening 143 is arranged to face each of the reticle chambers 110a that belong to the first column of the storage rack 110. The third opening 144 is arranged to face each of the reticle chambers 110a that belong to the second column of the storage rack 110. It is noted that the examples in FIGS. 8A to 8D show that the second opening 143 is positioned 90 degrees away from the first opening 142 in a clockwise direction, and the third opening 144 is positioned 180 degrees away from the first opening 142 in a clockwise direction, for example.

The transferring apparatus 130 is included in the cylinder 141 to be able to rotate and vertically travel inside the cylinder 141. Together with the transferring apparatus 130, the first shield 140 can vertically travel along the elevator guide 160 shown in FIG. 1.

Figure 9:
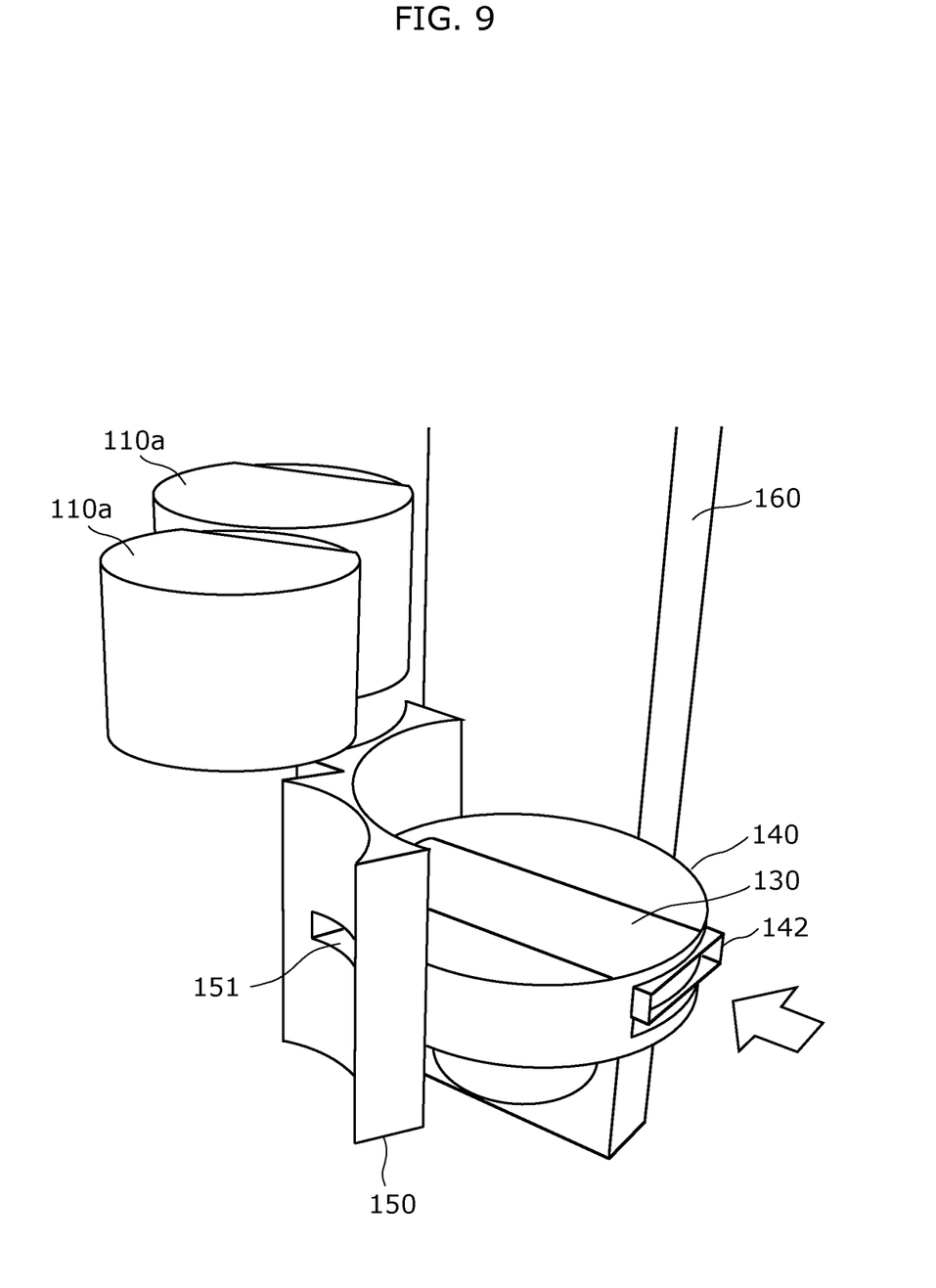
FIG. 9 shows how the transferring apparatus and the load port face each other.
Figure 11:
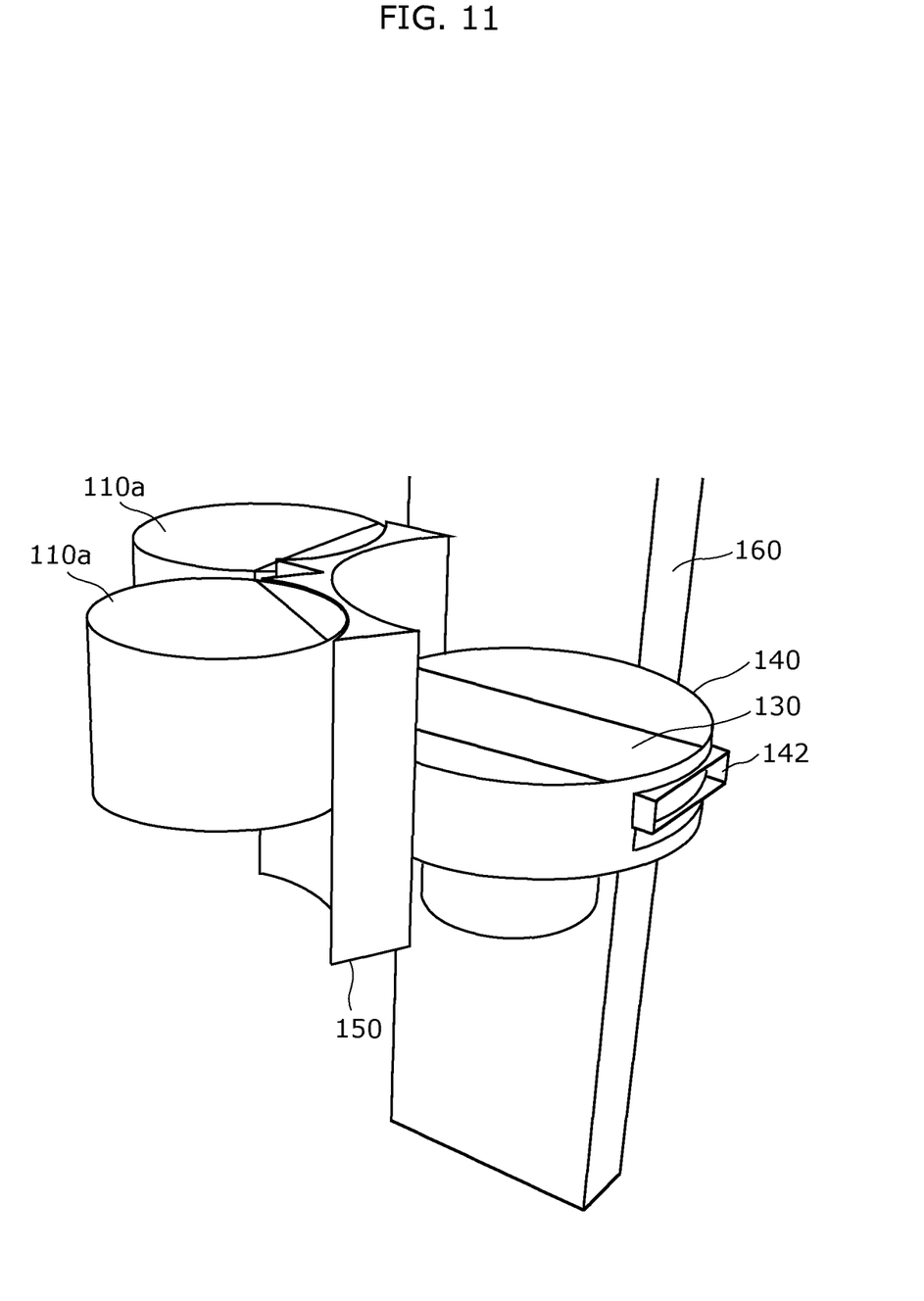
FIG. 11 shows how a loading and unloading opening appears on the reticle chamber in FIG. 10.

A second shield 150, as shown in FIG. 9, is attached to the outer sidewall of the cylinder 141 of the first shield 140, and travels together with the transferring apparatus 130 and the first shield 140. FIG. 11 shows that the second shield 150 travels to a position to face a reticle chamber 110a, and closes the loading and unloading opening 113 for reticles. The second shield 150 includes a connecting hole 151 to selectively connect between (i) one of the second and third openings 143 and 144 on the first shield 140 and (ii) a portion of the loading and unloading opening 113 on the reticle chamber 110a. Here, the selective connection is made only to the portion through which the reticle passes.

The cleaning unit 170 may be an FFU, for example. Using a tube and the like, the cleaning unit 170 supplies the inside of the storage rack 110 and the loading and unloading space 121 of the load port 120 with clean dry air (CDA) refined by a DCA refining apparatus provided outside. The DCA keeps clean the inside of the storage rack 110 and the loading and unloading space 121. The CDA is not directly supplied from the cleaning unit 170 to the holding space 131 of the transferring apparatus 130; however, when the holding space 131 connects to one of the storage rack 110 and the loading and unloading space 121, the CDA is supplied from the storage rack 110 and the loading and unloading space 121 to the holding space 131 to keep the holding space 131 clean. In other words, the keeping clean means that the CDA supplied from the outside is directly or indirectly supplied to each of the units thorough the cleaning unit 170 that operates as an FFU.

Figure 10:
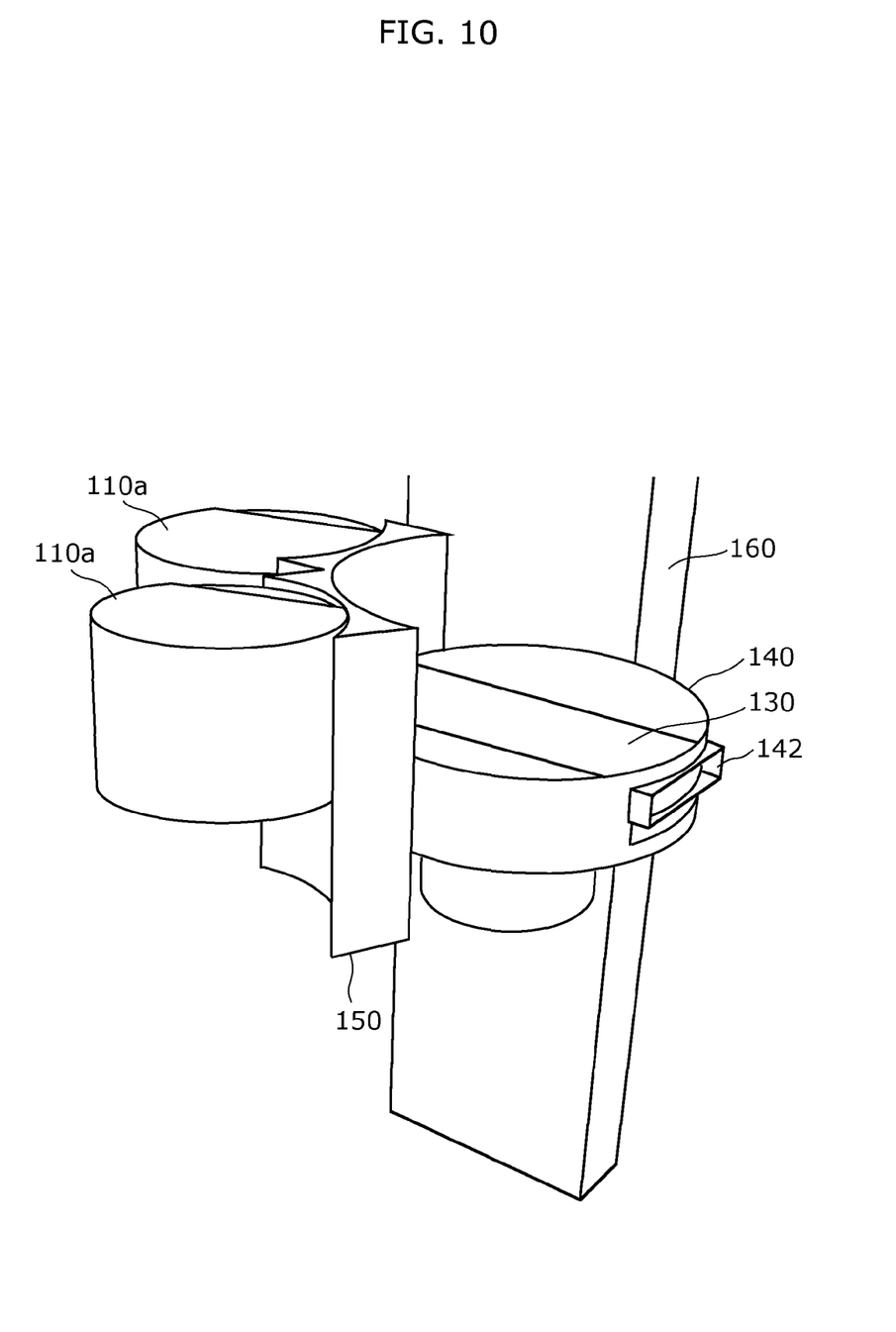
FIG. 10 shows how the transferring apparatus and a reticle chamber face each other.

With reference to FIGS. 8A to 11, described herewith are exemplary operations of the transferring apparatus 130 in transferring the reticle in the load port 120 to the storage rack 110. FIGS. 8A to 8D show exemplary operations of the transferring apparatus 130 inside the first shield 140. FIGS. 9 to 11 show positional relationships between the first and second shields 140 and 150 and the reticle chamber 110a. It is noted that the process below may be reversed to transfer a reticle on the storage rack 110 to the load port 120, and the details thereof shall be omitted.

First, as shown in FIG. 9, the transferring apparatus 130, the first shield 140 and the second shield 150 (hereinafter referred to as "the transferring apparatus 130 and the like") are moved along the elevator guide 160 to a position where the first opening 142 of the first shield 140 faces the load port 120 (not shown in FIG. 9).

Figure 8A:
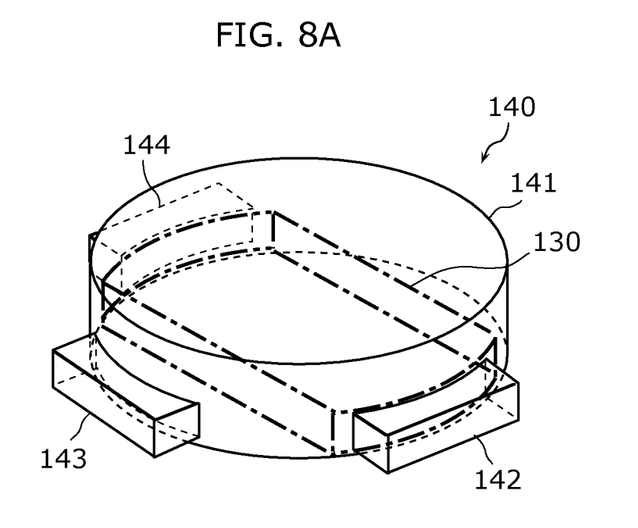
FIG. 8A shows an exemplary operation of the transferring apparatus inside a shield.

Next, as shown in FIG. 8A, the transferring apparatus 130 is rotated inside the cylinder 141 to the position where the opening 132 for the holding space 131 faces the first opening 142 of the first shield 140. Hence, through the first opening 142, the loading and unloading space 121 of the load port 120 and the holding space 131 of the transferring apparatus 130 are connected with each other. The transferring apparatus 130 then obtains the reticle in the load port 120 with the sliding fork 133 and stores the reticle in the holding space 131.

Figure 8B:
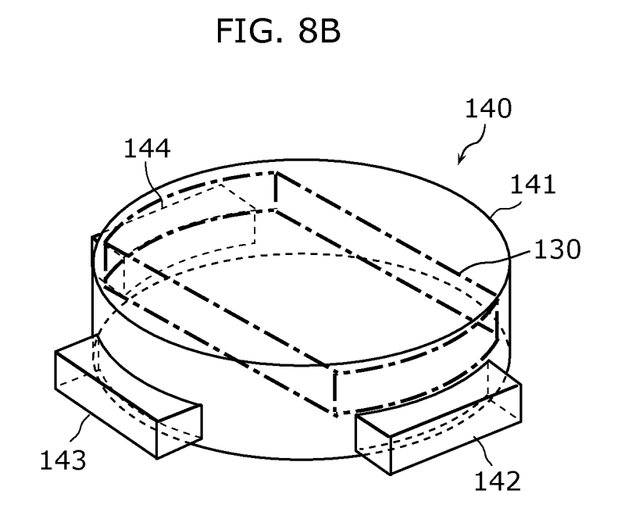
FIG. 8B shows an exemplary operation of the transferring apparatus inside the shield.

Next, as shown in FIG. 8B, the transferring apparatus 130 is elevated inside the cylinder 141 to the position where the opening 132 for the holding space 131 does not face any of the opening 142, the opening 143, or the opening 144. Hence, the opening 132 for the holding space 131 is closed with the inner sidewall of the first shield 140.

Figure 8C:
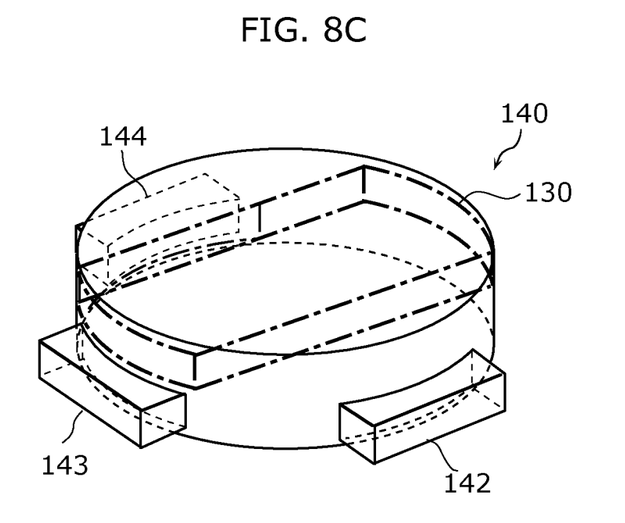
FIG. 8C shows an exemplary operation of the transferring apparatus inside the shield.

Then, as shown in FIG. 8C, the transferring apparatus 130 in FIG. 8B is rotated inside the cylinder 141 as much as 90 degrees clockwise, for example. It is noted that, prior to the rotation, the transferring apparatus 130 is elevated so that the opening 132 for the holding space 131 is kept closed with the inner sidewall of the cylinder 141. Such an operation contributes to preventing the CDA supplied from the cleaning unit 170 from leaking out of the holding space 131.

Next, as shown in FIG. 10, the transferring apparatus 130 and the like are moved along the elevator guide 160 to a position where second opening 143 of the first shield 140 faces a reticle chamber 110a. More specifically, the connecting hole 151 on the second shield 150 is to face a position of a rack, included in the reticle chamber 110a, on which the reticle to be placed.

Then, as shown in FIG. 11, the outer cover 112 of the reticle chamber 110a is rotated so that the openings 111a and 112a match with each other to form the loading and unloading opening 113. Here, the loading and unloading opening 113 on the reticle chamber 110a is closed with the second shield 150 except the position of the connecting hole 151, which contributes to reducing the amount of the CDA to leak out of the reticle chamber 110a.

Figure 8D:
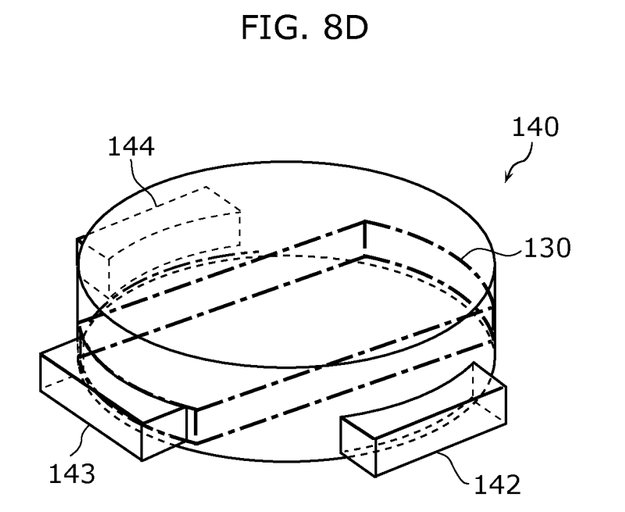
FIG. 8D shows an exemplary operation of the transferring apparatus inside the shield.

Next, as shown in FIG. 8D, the transferring apparatus 130 is lowered inside the cylinder 141 to the position where the opening 132 for the holding space 131 faces the second opening 143 of the first shield 140. Hence, the reticle chamber 110a connects to the holding space 131 of the transferring apparatus 130 through the first opening 142 and the connecting hole 151. The transferring apparatus 130 then transfers the reticle from the holding space 131 to the storage rack 110, using the sliding fork 133.

As a result of the above features, it is the inside of the reticle chamber 110a, the loading and unloading space 121 of the load port 120 and the holding space 131 of the transferring apparatus 130 alone that the cleaning unit 170 has to keep clean. In other words, the unique features and arrangement described above eliminate the need of keeping the entire transportation route of reticles as a conventional clean stocker has to do so, which contributes to reducing the space to be cleaned. The resulting smaller cleaning space allows storage expenses to decrease and contributes to efficient prevention of contamination of the reticles.

It is noted that the above description is one non-limiting example, and therefore the present invention is not limited to the above-described example and many variations and modifications are possible within the scope of the present invention. For example, the order of the each of the operations may partly be changed. Specifically, the transferring apparatus 130 and the like may be first elevated to the position of the reticle chamber 110a, and then the transferring apparatus 130 inside the first shield 140 in FIG. 8B may be rotated as shown in FIG. 8C. Moreover, as an example, the transferring apparatus 130 preferably is elevated inside the cylinder 141 as shown in FIG. 8B and the transferring apparatus 130 preferably is lowered in the cylinder 141 as shown in FIG. 8D; instead, transferring apparatus 130 may be lowered prior to the rotation and elevated after the rotation.

Preferred Embodiment 2

Figure 12:
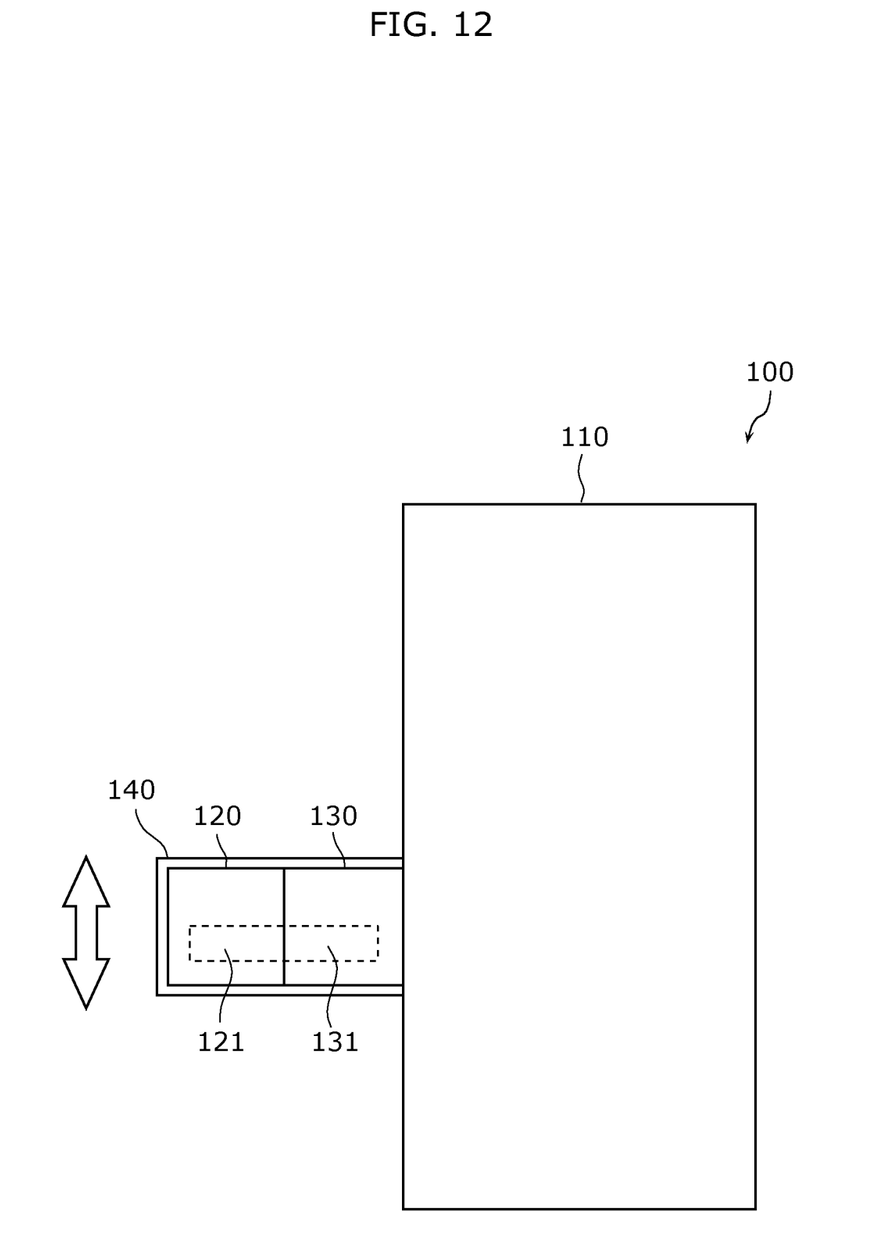
FIG. 12 schematically shows a clean stocker according to Preferred Embodiment 2 of the present invention.

FIG. 12 schematically shows the clean stocker 100 which exemplifies an automated warehouse according to Preferred Embodiment 2 of the present invention. It is noted that the details shared between Preferred Embodiments 1 and 2 shall be omitted, and mainly described here are the differences therebetween.

In the clean stocker 100 shown in FIG. 12, the load port 120 travels together with the transferring apparatus 130. Moreover, the loading and unloading space 121 of the load port 120 and the holding space 131 of the transferring apparatus 130 are connected with each other. Furthermore, the first shield 140 covers all the load port 120 and the transferring apparatus 130 to close the loading and unloading space 121 and the holding space 131 that are connected with each other. The cleaning unit 170 (not shown in FIG. 12) then supplies the interconnected loading and unloading space 121 and holding space 131 with CDA to keep the spaces clean.

The above features allow the reticle taken out of a case at the load port 120 to be transported to the storage rack 110 without moving the reticle out of a clean space. Furthermore, compared with the features described in Preferred Embodiment 1, the features in Preferred Embodiment 2 make it possible to simplify the structure of each constituent element. In other words, the first shield 140 does not have to be cylindrical or substantially cylindrical, nor does the transferring apparatus 130 have to be rotated therein either. In addition, the storage rack 110 may be a rotation rack like a conventional rack.

It is noted that Preferred Embodiments 1 and 2 show as an example the clean stocker 100 to store reticles; however, the present invention is not limited thereto. In other words, the present invention is applicable to automated warehouses that store any articles to be stored in clean spaces.

Although only some exemplary preferred embodiments of the present invention have been described in detail above, those skilled in the art will readily appreciate that many modifications and variations are possible in the exemplary preferred embodiments without materially departing from the novel teachings and advantages of the present invention. Accordingly, all such modifications are intended to be included within the scope of the present invention.

Preferred embodiments of the present invention are beneficial to automated warehouses to store articles in clean spaces.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An automated warehouse which places an article in a case, and brings in and takes out the article, the automated warehouse comprising:
    a storage rack which stores articles including the article;
    a load port which holds the case and includes a loading and unloading space to load and unload the article to and from the held case;
    a transferring apparatus which includes a holding space to hold the article and transfers the article between the holding space and the storage rack and between the holding space and the case held in the loading and unloading space, the holding space being a clean area that is required to be kept clean; and
    a first shield which closes the holding space and travels together with the transferring apparatus, wherein the first shield includes:
        a cylinder to contain the transferring apparatus in a rotatable manner;
        a first opening arranged on a side of the cylinder to face the load port; and
        a second opening arranged on a side of the cylinder to face the storage rack; and
    the transferring apparatus is arranged to:
        rotate to a position where an opening for the holding space faces the first opening, and transfer the article between the holding space and the load port;
        rotate to a position where the opening for the holding space faces the second opening, and transfer the article between the holding space and the storage rack; and
        rotate to a position where the opening for the holding space faces an inner sidewall of the cylinder, and travel together with the first shield while the holding space is closed.

2. The automated warehouse according to claim 1, wherein the transferring apparatus is arranged to move vertically inside the cylinder; and
    prior to rotation inside the cylinder, the transferring apparatus ascends or descends to a position where the opening for the holding space does not face either the first opening or the second opening.

3. The automated warehouse according to claim 1, further comprising:
    a second shield which is attached to an outer sidewall of the cylinder, travels together with the transferring apparatus and the first shield, and closes a loading and unloading opening on the storage rack to transfer the article when arriving at a position to face the storage rack; wherein
    the second shield includes a connecting hole to selectively connect between the second opening on the first shield and a portion of the loading and unloading opening on the storage rack, the selective connection being made only to the portion through which the article passes.

4. The automated warehouse according to claim 2, further comprising:
    a second shield which is attached to an outer sidewall of the cylinder, travels together with the transferring apparatus and the first shield, and closes a loading and unloading opening on the storage rack to transfer the article when arriving at a position to face the storage rack; wherein
    the second shield includes a connecting hole to selectively connect between the second opening on the first shield and a portion of the loading and unloading opening on the storage rack, the selective connection being made only to the portion through which the article passes.

* * * * *